(12) United States Patent
Markanday et al.

(10) Patent No.: US 12,245,510 B2
(45) Date of Patent: Mar. 4, 2025

(54) PIEZOELECTRIC COMPOSITIONS AND USES THEREOF

(71) Applicant: SABIC Global Technologies B.V., Bergen op Zoom (NL)

(72) Inventors: Meghna Markanday, Bangalore (IN); Pradeep Singh, Bangalore (IN); Venkata Ramanarayanan Ganapathy Bhotla, Bangalore (IN); Anshita Sudarshan, Bangalore (IN)

(73) Assignee: SABIC Global Technologies B.V., Bergen op Zoom (NL)

( * ) Notice: Subject to any disclaimer, the term of this patent is extended or adjusted under 35 U.S.C. 154(b) by 807 days.

(21) Appl. No.: 17/309,958

(22) PCT Filed: Jan. 7, 2020

(86) PCT No.: PCT/IB2020/050091
§ 371 (c)(1),
(2) Date: Jul. 6, 2021

(87) PCT Pub. No.: WO2020/144578
PCT Pub. Date: Jul. 16, 2020

(65) Prior Publication Data
US 2022/0069195 A1 Mar. 3, 2022

Related U.S. Application Data

(60) Provisional application No. 62/789,145, filed on Jan. 7, 2019.

(51) Int. Cl.
*H01L 41/18* (2006.01)
*C08K 3/013* (2018.01)
(Continued)

(52) U.S. Cl.
CPC .......... *H10N 30/852* (2023.02); *C08K 3/013* (2018.01); *C08K 3/22* (2013.01); *C08K 5/053* (2013.01);
(Continued)

(58) Field of Classification Search
CPC ............................. H10N 30/852; H10N 30/80
See application file for complete search history.

(56) References Cited

U.S. PATENT DOCUMENTS 6,787,238 B2 9/2004 Zhang et al.
8,878,341 B2 11/2014 Almadhoun et al.
(Continued)

FOREIGN PATENT DOCUMENTS

CN 102299254 12/2011
CN 105826508 8/2016
(Continued)

OTHER PUBLICATIONS

Arlt K. et al.: "Piezoelectric PZT / PVDF-copolymer 0-3 composites: aspects on film preparation and electrical poling," in IEEE *Transactions on Dielectrics and Electrical Insulation*, vol. 17, No. 4, pp. 1178-1184, Aug. 2010, doi: 10.1109/TDEI.2010.5539688.
(Continued)

*Primary Examiner* — Bryan P Gordon
(74) *Attorney, Agent, or Firm* — Norton Rose Fulbright US LLP

(57) ABSTRACT

Piezoelectric composites are described. A piezoelectric composite can include a polymeric matrix, piezoelectric additive (s), and polyol. Methods of making and using the piezoelectric composite are also described.

19 Claims, 2 Drawing Sheets

(51) Int. Cl.
  *C08K 3/22* (2006.01)
  *C08K 5/053* (2006.01)
  *C08L 27/16* (2006.01)
  *H10N 30/092* (2023.01)
  *H10N 30/098* (2023.01)
  *H10N 30/85* (2023.01)

(52) U.S. Cl.
  CPC ............ *C08L 27/16* (2013.01); *H10N 30/092* (2023.02); *H10N 30/098* (2023.02); *C08K 2003/2237* (2013.01)

(56) References Cited

U.S. PATENT DOCUMENTS

| | | | | |
|---|---|---|---|---|
| 2007/0052323 | A1* | 3/2007 | Kaminski | B06B 1/0677 310/311 |
| 2007/0167803 | A1* | 7/2007 | Kaminski | B06B 1/0677 600/459 |
| 2013/0285510 | A1* | 10/2013 | Chuang | C04B 35/62876 310/339 |
| 2020/0098969 | A1* | 3/2020 | Kalnitsky | H10N 30/04 |
| 2022/0069195 | A1* | 3/2022 | Markanday | C08K 5/053 |

FOREIGN PATENT DOCUMENTS

| | | |
|---|---|---|
| CN | 106007711 | 10/2016 |
| CN | 107207893 | 9/2017 |
| JP | H05330901 | 12/1993 |

OTHER PUBLICATIONS

Bauer F., et al.: "Recent advances in highly electrostrictive P(VDF-TrFE-CFE) terpolymers," in *IEEE Transactions on Dielectrics and Electrical Insulation*, vol. 13, No. 5, pp. 1149-1154, Oct. 2006, doi: 10.1109/TDEI.2006.247843.

International Search Report and Written Opinion for Application No. PCT/IB2020/050091, mailed Apr. 20, 2020, 24 pages.

Ploss B., et al.: Poling study of PZT/P(VDF-TrFE) composites, Composites Science and Technology, vol. 61, Issue 7, 2001, pp. 957-962, ISSN 0266-3538, https://doi.org/10.1016/S0266-3538(00)00193-7.

Xia F., et al.: High Electromechanical Responses in a Poly(vinylidene fluoride-trifluoroethylene-chlorofluoroethylene) Terpolymer. Adv. Mater., 14: 1574-1577. (2002) https://doi.org/10.1002/1521-4095(20021104)14:21<1574::AID-ADMA1574>3.0.CO:2-#.

* cited by examiner

PIEZOELECTRIC COMPOSITIONS AND USES THEREOF

CROSS REFERENCE TO RELATED APPLICATIONS

This application is a national phase application under 35 U.S.C. § 371 of International Application No. PCT/IB2020/050091 filed Jan. 7, 2020, which claims the benefit of priority of U.S. Provisional Patent Application No. 62/789,145 filed Jan. 7, 2019, all of which are hereby incorporated by reference in their entirety.

BACKGROUND OF THE INVENTION

A. Field of the Invention

The invention generally concerns a piezoelectric composite that includes a piezoelectric additive, polymeric matrix and at least 1.5 wt. % of polyol based on the weight of the piezoelectric composite.

B. Description of Related Art

Piezoelectric materials can be polymeric, ceramic or single crystalline in nature. Ceramics are less expensive and easier to fabricate than polymers or single crystals. Ceramics also have relatively high dielectric constants as compared to polymers and good electromechanical coupling coefficients. Ceramics suffer from high acoustic impedance, which results in poor acoustic matching with media such as water and human tissue—the media through which it is typically transmitting or receiving a signal. In addition, ceramics can exhibit high stiffness and brittleness; and cannot be formed onto curved surfaces, which contributes to limited design flexibility in a given transducer. Finally, the electromechanical resonances of piezoelectric ceramics give rise to a high degree of noise, which is an unwanted artifact in the context of transducer engineering.

Single crystal piezoelectric material can include crystals of quarts tourmaline and potassium-sodium tartrate. Other single crystals can include lead metaniobate ($PbNb_2O_6$) or relaxor systems such as $Pb(Sc_{1/2}Nb_{1/2})O_3$—$PbTiO_3$, $Pb(In_{1/2}Nb_{1/2})O_3$—$PbTiO_3$ and $Pb(Yb_{1/2}Nb_{1/2})O_3$—$PbTiO_3$, (1-2x) $BiScO_3$-x$PbTiO_3$. As with ceramics, any one single piezoelectric material phase (ceramic or crystal or polymer) does not provide all of the desired features for an application, and the performance is thereby limited by the trade-off between high piezoelectric activity and low density with mechanical flexibility.

Polymers can induce semi-crystalline polymers that exhibit ferroelectric properties. By way of example, PVDF is a semi-crystalline polymer which exists in four different phases viz. α, β, γ, and δ. Of the four distinct phases that PVDF can assume, β-phase is the only one that exhibits a spontaneous polarization, and thus piezoelectricity. PVDF polymer offers unique advantages over ceramic such as they are flexible and therefore can be formed easily on to the curved surfaces. Further, PVDF is chemically inert, tough, creep resistant, and has good stability when exposed to sunlight. In addition, it has a low density along with low dielectric permittivity resulting in a very high voltage coefficient. Due to its excellent mechanical flexibility, biocompatibility, and solution based processability, it has been actively being investigated for applications including nonvolatile low-voltage memory, acoustic transducers and implantable medical devices. PVDF and its copolymers (PVDF-TrFE, PVDF-TrFE-CFE) are some of the best standards when it comes to piezoelectric polymer performance. However, these polymers and copolymers suffer from processability problems such as fabrication into individual active elements, complex architectures, or three-dimensional (3D) patterns. PVDF also has several inherent disadvantages that make its use limited; such as low $d_{33}$ and dh values, low dielectric constant. Also, PVDF film requires high electric field for poling and makes the poling slightly difficult. Despite their high dielectric breakdown values, the low piezoelectric voltage constant makes them inapt for applications like energy harvesting.

Composite materials such as polymer ceramic composites (PVDF-PZT), have received a lot of attention as these materials can combine the excellent pyroelectric and piezoelectric properties of ceramics with the strength of polymers, flexibility, processing facility, levity, relatively high dielectric permittivity, and breakdown strength, which are not attainable in a single phase piezoelectric material. These properties make composites made of electro-active ceramics and a ferroelectric polymer very attractive for applications as they exhibit low acoustic impedance matching with water and human skin and their properties can be tailored to various requirements.

Piezoelectric composites can include polymeric materials and piezoelectric additives. Many piezoelectric polymers include a polymers instead of single piezoelectric material. Polymers can provide unique advantages over ceramic as they are flexible and therefore can be formed easily on to curved surfaces. Polymers can also offer the advantages of being chemically inert, tough, creep resistant, and have good stability when exposed to sunlight. In addition, fluorine-containing polymers can have a low density along with low dielectric permittivity resulting in a very high voltage coefficient. Due to its excellent mechanical flexibility, biocompatibility, and solution based processability, various polymers are being actively being investigated for applications including nonvolatile low-voltage memory, acoustic transducers and implantable medical devices.

Piezoelectric composites that include polymers can have high loading of piezoelectric and/or inorganic additives (>50%, v/v), thereby compromising their mechanical properties and flexibility. Due to the high loading of inorganic additives plasticizing agent or binder can be added to assist in making the composites. By way of example, Chinese Patent Application Publication No. 102299254 to Chen et al. describes a piezoelectric composite that includes a piezoelectric ceramic powder, a plasticizing agent, and polymer. However, the plasticizing agents can have a negative effect on the mechanical and piezoelectric properties.

Although various attempts to produce piezoelectric composites have been reported, there is still a need to produce composites with a balance of desired piezoelectric performance with the mechanical flexibility.

SUMMARY OF THE INVENTION

A discovery has been found that provides solutions to some of the afore-mentioned problems. The discovery is premised on a piezoelectric composite that includes a piezoelectric additive, at least 1.5 wt. % of a polyol, based on the total weight of the piezoelectric composite. The addition of the polyol produces the advantages of 1) reducing the dielectric difference between the piezoelectric additive and the polymer, 2) acting as a lubricant for softening of the composite, thereby increasing the flexibility of the composite, and 3) facilitation of the dispersion of the piezoelectric additive in the polymeric matrix, resulting in improvement of the overall piezoelectric coefficient $d_{33}$ as compared to piezoelectric materials having minimal amounts of polyol, or absent the polyol.

In one aspect of the invention, piezoelectric composites are described. The piezoelectric composites can be mechanically flexible (e.g., a mechanically flexible film). A piezoelectric composite can include a piezoelectric additive, a polymeric matrix (e.g., a thermoplastic or thermoset polymer or blends thereof, preferably a thermoplastic polymer, more preferably a thermoplastic piezoelectric polymer, or most preferably, a polyvinylidene difluoride (PVDF) polymer, a copolymer thereof, or a terpolymer thereof), and at least 1.5 wt. % of a polyol based on the total weight of the piezoelectric composite. Non-limiting examples of polyols include glycerol, ethylene glycol, polyethylene glycol, propylene glycol, alkylene glycols or mixtures thereof. In a particular aspect, the composite includes at least 1.5 wt. % glycerol, or from 2 wt. % to 30 wt. %, preferably 3 wt. % to 20 wt. %, or more preferably 4-10 wt. % glycerol. The glycerol containing piezoelectric composite can have piezoelectric constant ($d_{33}$ pC/N) that is greater than the piezoelectric constant of the piezoelectric composite absent the polyol. By way of example, greater than 55 pC/N, preferably 56 pC/N to 70 pC/N, or more preferably 58 pC/N to 65 pC/N. In some aspects, the piezoelectric composite has a dielectric constant at 100 Hz that is less than the dielectric constant of the piezoelectric composite absent the polyol at 100 Hz. By way of example, the dielectric constant can be less than 100, preferably less than 80, more preferably less than 70, or even more preferably 35 to 65. In certain aspects, the piezoelectric additive can be dispersed in the polymeric matrix and the glycerol can be solubilized in the polymeric matrix. Piezoelectric additives included in the piezoelectric composite can include ceramics, preferably those having a perovskite structure. In certain aspects, the piezoelectric composite can include 2 to 70 wt. % polymer matrix and 30 to 98 wt. % lead zirconate titanate (PZT). A PZT glycol containing piezoelectric composite can have a $d_{33}$ of at least 60 pC/N, preferably 60 pC/N to 65 pC/N, and a dielectric constant at 100 Hz of less than 65, preferably 35 to 45.

In yet another aspect of the present invention, methods of producing piezoelectric composites of the present invention are described. A method can include (a) obtaining a solution that includes a polyol and a polymer in a solvent, (b) dispersing a piezoelectric additive in the solution; and (c) subjecting the dispersion of step (b) to conditions suitable to form the piezoelectric composite of the present invention. The step (a) solution can include at least 1 wt. % of the polyol based on the weight percentage of polymer. In some embodiments, the step (a) solution includes 1 to 30 wt. % of polyol, and 70 wt. % to 99 wt. % polymer. In a preferred aspect, the polyol is glycerol, the polymer is a thermoplastic polymer, a thermosetting polymer or copolymer, or a blend thereof, preferably, PVDF or PVDF-TRFE-CFE or a blend thereof; and/or the piezoelectric additive is a perovskite material, preferably PZT. The piezoelectric materials can be formed into a film or a sheet.

In still another aspect of the present invention, devices that include the piezoelectric composite of the present invention are described. Devices can include a piezoelectric sensor, a piezoelectric transducer, or a piezoelectric actuator. The device can be mechanically flexible.

In the context of the present invention, 20 embodiments are described. Embodiment 1 is a piezoelectric composite comprising a piezoelectric additive, a polymeric matrix, and at least 1.5 wt. % of a polyol based on the total weight of the piezoelectric composite. Embodiment 2 is the piezoelectric composite of embodiment 1, wherein the polyol is glycerol, alkylene glycols or mixtures thereof, preferably glycerol, ethylene glycol, polyethylene glycol, propylene glycol, or mixtures thereof. Embodiment 3 is the piezoelectric composite of any one of embodiments 1 to 2, having from 2 wt. % to 30 wt. %, preferably 3 wt. % to 20 wt. %, or more preferably 4-10 wt. % glycerol. Embodiment 4 is the piezoelectric composite of embodiment 3, wherein the piezoelectric composite has a piezoelectric constant ($d_{33}$ pC/N) that is greater than the piezoelectric constant of the piezoelectric composite absent the polyol. Embodiment 5 is the piezoelectric composite of embodiment 4, wherein the $d_{33}$ of the piezoelectric composite having the polyol is greater than 55 pC/N, preferably 56 pC/N to 70 pC/N, or more preferably 58 pC/N to 65 pC/N. Embodiment 6 is the piezoelectric composite of any one of embodiments 1 to 5, wherein the piezoelectric composite has a dielectric constant at 100 Hz that is less than the dielectric constant of the piezoelectric composite absent the polyol at 100 Hz. Embodiment 7 is the piezoelectric composite of embodiment 6, wherein the dielectric constant of the piezoelectric composite having the polyol is less than 100, preferably less than 80, more preferably less than 70, or even more preferably 35 to 65. Embodiment 8 is the piezoelectric composite of any one of embodiments 1 to 7, wherein the piezoelectric additive is dispersed in the polymeric matrix and the glycerol is solubilized in the polymeric matrix. Embodiment 9 is the piezoelectric composite of any one of embodiments 1 to 8, wherein the piezoelectric additive is a ceramic, preferably having a perovskite structure. Embodiment 10 is the piezoelectric composite of any one of embodiments 1 to 9, wherein the piezoelectric composite comprises 2 to 70 wt. % polymer matrix and 30 to 98 wt. % lead zirconate titanate (PZT). Embodiment 11 is the piezoelectric composite of embodiment 10, having: a $d_{33}$ of at least 60 pC/N, preferably 60 pC/N to 65 pC/N; and a dielectric constant at 100 Hz of less than 65, preferably 35 to 45. Embodiment 12 is the piezoelectric composite of any one of embodiments 1 to 11, wherein the piezoelectric composite is mechanically flexible film. Embodiment 13 is the piezoelectric composite of any one of embodiments 1 to 12, wherein the polymeric matrix comprises a thermoplastic or thermoset polymer or blends thereof, preferably a thermoplastic polymer, more preferably a thermoplastic piezoelectric polymer, or most preferably, a polyvinylidene difluoride (PVDF) polymer, a copolymer thereof, or a terpolymer thereof.

Embodiment 14 is a method of producing the piezoelectric composite of any one of embodiments 1 to 13, the method comprising: (a) obtaining a solution comprising polyol, a polymer, and optional solvent, wherein the solution includes at least 1 wt. % of the polyol based on the weight percentage of polymer; (b) dispersing a piezoelectric additive in the solution; and (c) subjecting the dispersion of step (b) to conditions suitable to form the piezoelectric composite of any one of embodiments 1 to 13. Embodiment 15 is the method of embodiment 14, wherein step (c) conditions comprise (i) solvent casting the dispersion on a substrate; (ii) air/drying/heat treating the step (i) dispersion to form a composite; and (iii) applying a poling field to the composite to form a piezoelectric composite. Embodiment 16 is the method of any one of embodiments 14 to 15, wherein the step (a) solution comprises 1 to 30 wt. % of polyol, and 70 wt. % to 99 wt. % polymer. Embodiment 17 is the method of any one of embodiments 14 to 16, wherein: the polyol is glycerol; the polymer is a thermoplastic polymer, a thermosetting polymer or copolymer, or a blend thereof, preferably, PVDF or PVDF-TRFE-CFE or a blend thereof; and/or the piezoelectric additive is a perovskite material, preferably a lead-zirconium-titanate (PZT). Embodiment 18 is the method of any one of embodiments 14 to 17, wherein the composite is a film or sheet.

Embodiment 19 is a piezoelectric device comprising any one of the piezoelectric composites of embodiments 1 to 13. Embodiment 20 is the piezoelectric device of embodiment 19, wherein the device is a piezoelectric sensor, a piezoelectric transducer, or a piezoelectric actuator, and wherein the device is preferably mechanically flexible.

Other embodiments of the invention are discussed throughout this application. Any embodiment discussed with respect to one aspect of the invention applies to other aspects of the invention as well and vice versa. Each embodiment described herein is understood to be embodiments of the invention that are applicable to other aspects of the invention. It is contemplated that any embodiment discussed herein can be implemented with respect to any method or composition of the invention, and vice versa. Furthermore, compositions and kits of the invention can be used to achieve methods of the invention.

The following includes definitions of various terms and phrases used throughout this specification.

The term "polyol" refers to an organic compound that includes at least 2 hydroxyl (OH) groups.

The terms "about" or "approximately" are defined as being close to as understood by one of ordinary skill in the art. In one non-limiting embodiment, the terms are defined to be within 10%, preferably within 5%, more preferably within 1%, and most preferably within 0.5%.

The terms "wt. %", "vol. %", or "mol. %" refers to a weight percentage of a component, a volume percentage of a component, or molar percentage of a component, respectively, based on the total weight, the total volume of material, or total moles, that includes the component. In a non-limiting example, 10 grams of component in 100 grams of the material is 10 wt. % of component.

The term "substantially" and its variations are defined to include ranges within 10%, within 5%, within 1%, or within 0.5%.

The terms "inhibiting" or "reducing" or "preventing" or "avoiding" or any variation of these terms, when used in the claims and/or the specification includes any measurable decrease or complete inhibition to achieve a desired result.

The term "effective," as that term is used in the specification and/or claims, means adequate to accomplish a desired, expected, or intended result.

The use of the words "a" or "an" when used in conjunction with any of the terms "comprising," "including," "containing," or "having" in the claims, or the specification, may mean "one," but it is also consistent with the meaning of "one or more," "at least one," and "one or more than one."

The words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

The piezoelectric composites of the present invention can "comprise," "consist essentially of," or "consist of" particular ingredients, components, compositions, etc. disclosed throughout the specification. With respect to the transitional phrase "consisting essentially of," in one non-limiting aspect, a basic and novel characteristic of the piezoelectric composites of the present invention is that they are mechanically flexible and/or have a higher piezoelectric composites with less than 1.5 wt. % of polyol.

Other objects, features and advantages of the present invention will become apparent from the following figures, detailed description, and examples. It should be understood, however, that the figures, detailed description, and examples, while indicating specific embodiments of the invention, are given by way of illustration only and are not meant to be limiting. Additionally, it is contemplated that changes and modifications within the spirit and scope of the invention will become apparent to those skilled in the art from this detailed description. In further embodiments, features from specific embodiments may be combined with features from other embodiments. For example, features from one embodiment may be combined with features from any of the other embodiments. In further embodiments, additional features may be added to the specific embodiments described herein.

BRIEF DESCRIPTION OF THE DRAWINGS

Advantages of the present invention may become apparent to those skilled in the art with the benefit of the following detailed description and upon reference to the accompanying drawings.

Figure 1:
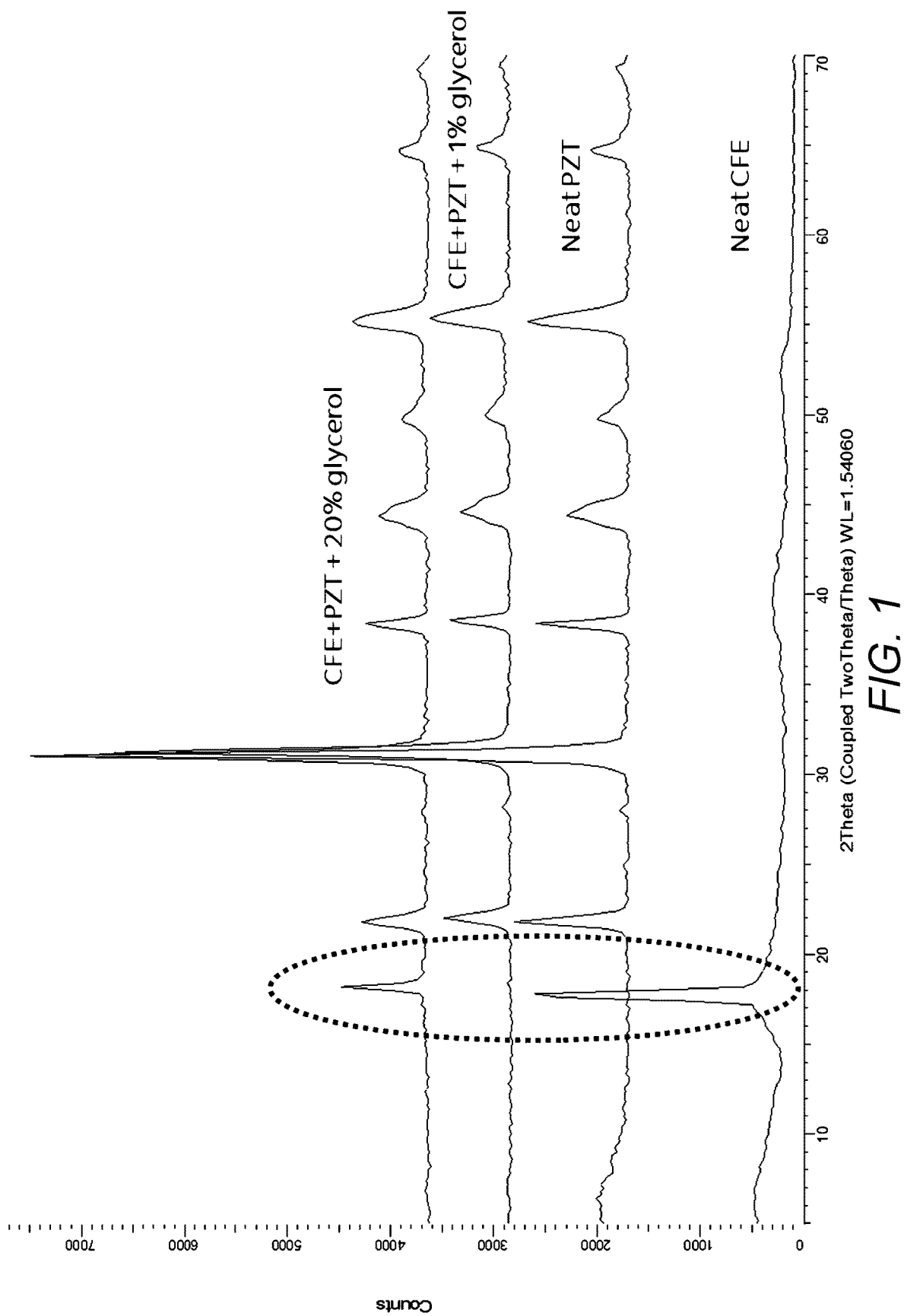
FIG. 1 shows X-ray diffraction (XRD) patterns of neat (bottom) PVDF-TrFE-CFE, neat PZT (second from bottom) and PVDF-TrFE-CFE/PZT/Glycerol (1%)(third from bottom) and PVDF-TrFE-CFE/PZT/Glycerol (20%) (top).

While the invention is susceptible to various modifications and alternative forms, specific embodiments thereof are shown by way of example in the drawings. The drawings may not be to scale.

DETAILED DESCRIPTION OF THE INVENTION

A discovery has been made that improves the mechanical and electrical properties of piezoelectric compositions. The discovery is premised on including at least 1.5 wt. % of a polyol to a polymeric matrix that includes a piezoelectric additive. The addition of the glycol can improve the overall dielectric constant ($d_{33}$) of the composite as compared to composites having less than but not equal to 1.5 wt. % polyol, assist in softening the polymeric matrix to increase flexibility of composite and/or facilitate dispersion of the piezoelectric additive in the polymeric matrix.

These and other non-limiting aspects of the present invention are discussed in further detail in the following sections.

A. Materials

1. Polyols

Polyols are organic compounds that include at least 2 OH groups. Polyols can include diols, triols, tetraols, alkylene glycols and the like. Non-limiting examples of polyols include glycerol, ethylene glycol, diethylene glycol, triethylene glycol, polyethylene glycol, 1,2-propylene glycol, tripropylene glycol, polypropylene glycol, 1,3-butanediol, poly(1,2-butylene glycol) and the like.

2. Piezoelectric Additives

The piezoelectric additive can be any ceramic or single crystal material. Non-limiting examples of piezoelectric materials include inorganic compounds of the perovskite family. Non-limiting examples of piezoelectric ceramics with the perovskite structure include barium titanate (BaTiO$_3$), lead titanate (PbTiO$_3$), lead zirconate titanate (Pb(Zr$_x$Ti$_{1-x}$)O$_3$, or PZT), lead lanthanum zirconate titanate (Pb$_{1-x}$, La$_x$(Zr$_y$T$_{1-y}$)$_{1-x/4}$O$_3$, or PLZT), and lead magnesium niobate-lead titanate (Pb(Mg$_{1/3}$Nb$_{2/3}$O$_3$)—PbTiO$_3$, or PMN-PT), hydroxyapatite, apatite, lithium sulfate monohydrate, sodium potassium niobate, quartz, tartaric acid, poly(vinylidene difluoride) fibers or combinations thereof. Other piezoelectric materials include a binary solid solution of PbZrO$_3$ (PZ-anti-ferroelectric), and PT (PT-a ferroelectric). In a preferred embodiment, the piezoelectric additive is PZT.

3. Polymers

The piezoelectric composite can include a thermoset polymer, copolymer and/or monomer, a thermoplastic polymer, copolymer and/or monomer or a thermoset/thermoplastic polymer or copolymer blend.

Thermoset polymers are malleable prior to heating and capable of forming a mold. The matrix can be made from a composition having a thermoplastic polymer and can also include other non-thermoplastic polymers, additives, and the like, that can be added to the composition. Thermoset polymeric matrices are cured or become cross-linked and tend to lose the ability to become pliable or moldable at raised temperatures. Non-limiting examples of thermoset polymers used to make the polymer film include epoxy resins, epoxy vinylesters, alkyds, amino-based polymers (e.g., polyurethanes, urea-formaldehyde), diallyl phthalate, phenolics polymers, polyesters, unsaturated polyester resins, dicyclopentadiene, polyimides, silicon polymers, cyanate esters of polycyanurates, thermosetting polyacrylic resins, bakelite, Duroplast, benzoxazines, or co-polymers thereof, or blends thereof.

Thermoplastic polymeric matrices have the ability to become pliable or moldable above a specific temperature and solidify below the temperature. The polymeric matrix of the composites can include thermoplastic or thermoset polymers, co-polymers thereof, and blends thereof that are discussed throughout the present application. Non-limiting examples of thermoplastic polymers include polyvinylidene fluoride (PVDF), PVDF polymer, PVDF copolymer, PVDF terpolymer, odd-numbered nylon, cyano-polymer, polyethylene terephthalate (PET), a polycarbonate (PC) family of polymers, polybutylene terephthalate (PBT), poly(1,4-cyclohexylidene cyclohexane-1,4-dicarboxylate) (PCCD), glycol modified polycyclohexyl terephthalate (PCTG), poly (phenylene oxide) (PPO), polypropylene (PP), polyethylene (PE), polyvinyl chloride (PVC), polystyrene (PS), polymethyl methacrylate (PMMA), polyethyleneimine or polyetherimide (PEI) and their derivatives, thermoplastic elastomer (TPE), terephthalic acid (TPA) elastomers, poly (cyclohexanedimethylene terephthalate) (PCT), polyethylene naphthalate (PEN), polyamide (PA), polysulfone sulfonate (PSS), sulfonates of polysulfones, polyether ether ketone (PEEK), polyether ketone ketone (PEKK), acrylonitrile butyldiene styrene (ABS), polyphenylene sulfide (PPS), co-polymers thereof, or blends thereof. In addition to these, other thermoplastic polymers known to those of skill in the art, and those hereinafter developed, can also be used in the context of the present invention. In some aspects of the invention, the preferred thermoplastic polymers include polypropylene, polyamide, polyethylene terephthalate, a polycarbonate (PC) family of polymers, polybutylene terephthalate, poly(phenylene oxide) (PPO), polyetherimide, polyethylene, co-polymers thereof, or blends thereof. In more preferred aspects, the thermoplastic polymers include polypropylene, polyethylene, polyamide, a polycarbonate (PC) family of polymers, co-polymers thereof, or blends thereof. The thermoplastic polymer can be included in a composition that includes said polymer and additives. Non-limiting examples of additives include coupling agents, antioxidants, heat stabilizers, flow modifiers, colorants, etc., or any combinations thereof. In a preferred instance, a polyvinylidene difluoride (PVDF) polymer, a copolymer thereof, or a terpolymer thereof is used.

B. Method of Producing Piezoelectric Composites

The piezoelectric composite can be made using solution casting or forming methodology. In step 1 a solution of a polyol and polymer described in the Materials section can be obtained. The solution can include a solvent, the polyol described in the Materials section and polymer described in the Materials section. The solvent can be any solvent capable of solubilizing the polymer. Non-limiting examples of solvents include tetrahydrofuran (THF), dimethylsulfoxide (DMSO), methyl ethyl ketone (MEK), acetone, dimethylformamide (DMF), or the like, the combination of the above-mentioned solvents. The solution can include at least, equal to, or between any two of 1 wt. %, 1.5 wt. %, 5 wt. %, 10 wt. %, 15 wt. %, 20 wt. %, 25 wt. %, and 30 wt. % of the polyol based on the weight percentage of the polymer. The solution can include 70 wt. % to 99 wt. % polymer, or at least, equal to, or between any two of 70 wt. %, 75 wt. %, 80 wt. %, 85 wt. %, 90 wt. %, 99 wt. %. In some embodiments, the solution includes 1 to 30 wt. % of polyol, and 70 wt. % to 99 wt. % polymer, or 10 wt. % to 25 wt. % polyol and 75 wt. % to 90 wt. % polymer, 15 wt. % to 20 wt. % polyol and 80 to 85 wt. % polymer. In some embodiments, the solution includes 10 wt. % to 25 wt. % glycerol and 75 wt. % to 90 wt. % PVDF or PVDF-TRFE-CFE or a blend thereof.

In step 2 of the method, the piezoelectric additive can be dispersed in the polyol/polymer solution. The piezoelectric additive can be a plurality (e.g., 2 or more, suitably 5 or more, 10 or more, 50 or more, 100 or more, 500 or more, 1000 or more, etc.) of piezoelectric particles. The piezoelectric particles can be dispersed in the solution via any suitable method, including mixing, stirring, folding or otherwise integrating the piezoelectric particles in the matrix so as to generate a fairly uniform mixture of the particles in the matrix. In some embodiments, the solution is added to the piezoelectric additive.

In step 3 of the method, the dispersion can be subjected to conditions suitable to form the piezoelectric composite of the present invention. In one instance, the dispersion includes glycerol, PVDF or PVDF-TRFE-CFE or a blend thereof, and PZT. In some embodiments, the dispersion can be shaped or cast. Shaped or shaping, or casting can include a mechanical or physical processes to changed to a desired form. Shaping can also include simply placing a dispersion into a desired container or receptacle, thereby providing it with a maintained shape or form. It should be noted that the shaped form is not necessarily the final form, as additional processing (e.g., machining, forming, etc.) can be completed on the final, cured composite. The act of shaping the dispersion for use in the methods described herein is primarily to give some initial structure to the dispersion prior to further processing. A rigid or specific shape is not required.

Casting can pouring the dispersion on a casting surface. Non-limiting examples of casting include air casting (e.g., the dispersion passes under a series of air flow ducts that control the evaporation of the solvents in a particular set period of time such as 24 to 48 hours), solvent or emersion casting, (e.g., the dispersion is spread onto a moving belt and run through a bath or liquid in which the liquid within the bath exchanges with the solvent). The spreading of the dispersion on the casting surface can be done with a doctor blade, rolling spreader bar or any of several configurations of flat sheeting extrusion dies.

During casting or shaping, the solvent can removed thereby leaving the dispersion on the substrate or in the mold. Heat can be applied to assist in the removal of the solvent. By way of example, the shaped material can be heated at a temperature of at least, equal to, or between any two of 50° C., 55° C., 60° C., 65° C., 70° C., 75° C., and 80° C. The resulting shaped polymeric composite material can be annealed at a temperature of at least, equal to, or between any two of 80° C., 85° C., 90° C., 95° C., 100° C., 105° C., 110° C., 115° C., and 120° C. The shaped material can be a film, a sheet or the like.

After annealing the shaped polymeric composite material can be subjected conditions to induce electric polarization in the piezoelectric additive (e.g., plurality of particles) in the polymeric composited material. During electric polarization, the piezoelectric particles can be connected to one another in a linear or semi-linear manner (e.g., chains of particles). Columns of piezoelectric particles are suitably formed by the stacking or aligning of more than one chain. In a non-limiting example, the shaped polymeric composite material can be poled. By way of example, the polymeric composite material can be poled with a selected electric field at room temperature (e.g., after cooling of the composite), or at a selected electric field at a selected temperature, at least one of the selected electric field and the selected temperature being chosen in accordance with a desired dipole orientation, a desired polarization strength, or property of the article of manufacture.

The temperature for performing poling can be in accordance with a desired dipole orientation and/or a desired polarization strength, or in accordance with a desired stress state of a finished actuator. For example, the poling of can be performed at a selected cooling temperature range, through a selected heating temperature, or through a selected heating temperature heating and cooling temperature range. In some instance, the poling may occur over a "range" (e.g., selected range) of temperatures rather than at a specific constant temperature. In some embodiments, poling can be performed at a temperature of at least, equal to, or between any two of 80° C., 85° C., 90° C., 95° C., 100° C., 105° C., 110° C., 115° C., and 120° C. The applied voltage level parameter for the poling can be selected in various ways. For example, the applied voltage level parameter can be selected as constant, or changing (e.g., ramped) over a period of time. In some embodiments, poling is performed using corona discharge.

C. Piezoelectric Composite

The piezoelectric composite can include a polymer, a piezoelectric additive, and at least 1.5 wt. % of a polyol based on the weight of the composite. The composite can includes at least, equal to, or between any two of 1.5 wt. %, 2 wt. %, 5 wt. %, 10 wt. %, 15 wt. %, 20 wt. %, 25 wt. %, and to 30 wt. % of a polyol described herein. In some embodiments, the composite includes at least, equal to, or between any two of 3 wt. %, 5 wt. %, 10 wt. %, 15 wt. %, 20 wt. %, of glycerol. The polyol can be solubilized in the polymeric matrix while the piezoelectric additive is dispersed throughout the polymeric matrix. The piezoelectric composite can include at least, equal to, or between any two of 2, 5, 10, 15, 20, 25, 30, 35, 40, 45, 50, 55, 60, 65 and 70 wt. % polymer matrix. The amount of lead-free piezoelectric additive can be at least, equal to, or between any two of 30, 35, 40, 45, 50, 55, 60, 65, 70, 75, 80, 85, 90, 95, and 98 wt. % piezoelectric additive. In some embodiments, the piezoelectric composite include 3 wt. % to 20 wt. % glycerol, 30 wt. % to 70 wt. % polymeric matrix and 30 wt. % to 80 wt. % PZT.

In some embodiments, the piezoelectric composite can have any shape or form. In some embodiments, the piezoelectric composite is a film or sheet. Properties of the piezoelectric composite include electrical and mechanical properties. Non-limiting examples of electrical properties can include piezoelectric constant, dielectric constant, and the like. The piezoelectric constant ($d_{33}$) can be greater than the piezoelectric constant of a piezoelectric composite that includes the same polymer, piezoelectric additive, and less than, but not equal to 1.5 wt. % of polyol. The $d_{33}$ of the piezoelectric composite having the polyol (e.g., glycerol) can be greater than, equal to, or between 55 pC/N, 56 pC/N, 57 pC/N, 58 pC/N, 59 pC/N, 60 pC/N, 61 pC/N, 62 pC/N, 63 pC/N, 64 pC/N, 65 pC/N, 66 pC/N, 67 pC/N, 68 pC/N, 69 pC/N, and 70 pC/N. The dielectric constant of the piezoelectric composite can be, at 100 Hz, less than the dielectric constant of the piezoelectric composite absent the polyol at 100 Hz. By way of example, the piezoelectric composite can have a dielectric constant that is less than, equal to, or between any two of 100, 95, 90, 85, 80, 75, 70, 65, 60, 55, 50, 45, 40, and 35.

Mechanical properties can include modulus, hardness, and the like. The piezoelectric composite of the present invention can have a modulus of at least, equal to, or between any two of 0.5, 0.55, 0.6, 0.65, 0.7, 0.75, 0.8, 0.85, 0.9, 1, 1.5, 2, 2.5, 3, 3.5, 4, 4.5 GPa. The hardness can be at least, equal to, or between any two of 0.010, 0.015, 0.020, 0.025, 0.05, 0.075, 0.1, 0.125, 0.15, 0.175 and 2. In a non-limiting example, and as illustrated in the Examples, the piezoelectric composite can include at least 1.5 to 2 wt. % glycerol, 45 to 55 wt. % PZT, and 43 to 54 wt. % polymer has a modulus 0.6 to 4.9 GPa and a hardness of 0.013 to 0.14 GPa. In another non-limiting example, and as illustrated in the Examples, the piezoelectric composite includes at least 18 to 22 wt. % glycerol, 45 to 55 wt. % PZT, and 23 to 37 wt. % polymer has a modulus 0.7 to 4.3 GPa and a hardness of 0.014 to 0.13 GPa.

D. Devices

The piezoelectric device can be included in a device. In a preferred instance, the device is flexible. In some particular, instances, the piezoelectric material of the present invention can be used in articles of manufacture that have curved surfaces, flexible surfaces, deformable surfaces, etc. Non-limiting examples of such articles of manufacture include a piezoelectric sensor, a piezoelectric transducer, a piezoelectric actuator. These components can be used in tactile sensitive devices, electronic devices (e.g., smart phones, tablets, computers, etc.), virtual reality devices, augmented reality devices, fixtures that require flexibility such as adjustable mounted wireless headsets and/or ear buds, communication helmets with curvatures, medical batches, flexible identification cards, flexible sporting goods, packaging materials, medical devices, and/or applications where the presence of a bendable material simplifies final product design, engineering, and/or mass production.

EXAMPLES

The present invention will be described in greater detail by way of specific examples. The following examples are offered for illustrative purposes only, and are not intended to limit the invention in any manner. Those of skill in the art will readily recognize a variety of noncritical parameters which can be changed or modified to yield essentially the same results.

Example 1

Preparation of Piezoelectric Polymeric Composites

Solution cast films were made using PVDF-TrFE-CFE as polymer and PZT or BT as ceramic filler with THF as solvent. Desired amount of PVDF-TrFE-CFE (ter-polymer) was weighed and dissolved in THF to make 10 w/w % solution with constant stirring. Glycerol (1-20 w/w % w.r.t. PVDF-TrFE-CFE) was added to this polymer solution and stirred further. This solution was added gradually to weighed amount of ceramic and allowed stirring for further few minutes and was then casted with doctor blade as a thin film on a glass plate.

The obtained films were annealed at 110° C. for 5 hours followed by sputtering of electrodes and poling as usually done conventionally for piezoelectric films. Poling was done at 110° C. Table 1 list the details of the terpolymer/glycerol/PZT formulations. Table 2 list the details of the terpolymer/glycerol/BT formulations. The comparative samples were made using the same methodology without the solvent.

TABLE 1

| # | Polymer | PZT (v/v %) | Glycerol (w/w %) | Remarks |
|---|---|---|---|---|
| 1 | PVDF-TrFE-CFE | 50 | — | Comparative Sample |
| 2 | PVDF-TrFE-CFE | 50 | 1 | Glycerol w % was added w.r.t. |
| 3 | PVDF-TrFE-CFE | 50 | 20 | PVDF-TrFe-CFE w % |
| 4 | PVDF-TrFE-CFE | 80 | — | Comparative Sample |
| 5 | PVDF-TrFE-CFE | 80 | 1 | Glycerol w % was added w.r.t. |
| 6 | PVDF-TrFE-CFE | 80 | 20 | PVDF-TrFe-CFE w % |

TABLE 2

| Sample Code | Polymer | BT (v/v %) | Glycerol (w/w %) | Remarks |
|---|---|---|---|---|
| CFE-50BT | PVDF-TrFE-CFE | 50 | — | Comparative Sample |
| CFE-50BT-20 gly | PVDF-TrFE-CFE | 50 | 20 | Glycerol w % was added w.r.t. PVDF-TrFe-CFE w % |

Example 2

Characterization of Piezoelectric Polymeric Composites

A physical and electrical properties of Examples 1-3 were obtained.

X-ray Diffraction (XRD): XRD analysis was done using a Bruker D8 Advance XRD (Bruker, USA) from 5 degree to 70 degree was used determine the crystallinity of the films with and without addition of glycerol. FIG. 1 shows XRD pattern of neat PVDF-TrFE-CFE, neat PZT and PVDF-TrFE-CFE/PZT/Glycerol (1%) and PVDF-TrFE-CFE/PZT/Glycerol (20%). Appearance of PVDF-TrFE-CFE peak in composite film with 20%/Glycerol, was indicative of an increase in crystallinity of PVDF-TrFE-CFE with the addition of glycerol (circled)

Figure 2:
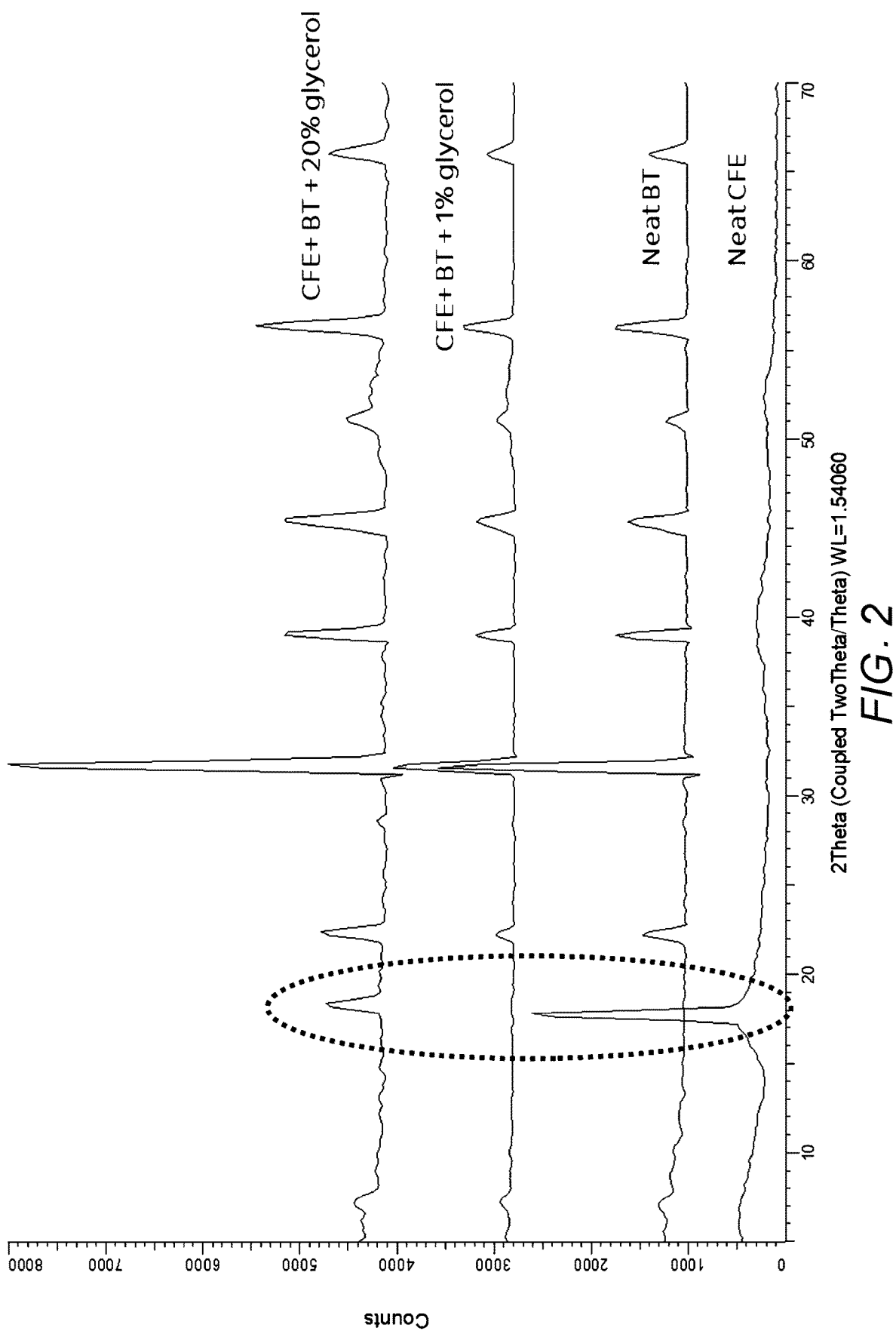
FIG. 2 shows XRD patterns of neat PVDF-TrFE-CFE (bottom), neat $BaTiO_3$ (second from bottom) and PVDF-TrFE-CFE/$BaTiO_3$/Glycerol (1%) (third from bottom) and PVDF-TrFE-CFE/$BaTiO_3$/Glycerol (20%) (top).

FIG. 2 shows the XRD pattern of neat PVDF-TrFE-CFE, neat BaTiO$_3$ and PVDF-TrFE-CFE/BaTiO$_3$/Glycerol (1%) and PVDF-TrFE-CFE/BaTiO$_3$/Glycerol (20%). Appearance of PVDF-TrFE-CFE peak in composite film with 20% Glycerol, was indicative of increase in crystallinity of PVDF-TrFE-CFE with addition of glycerol. It was observed that the addition of glycerol influenced the crystallinity of the film. An additional peak appeared at around 18 degree by adding 20% of glycerol, which corresponds to PVDF-TrFE-CFE (circled) crystallinity.

Electrical Properties. A Novocontrol impedance analyzer (Novocontrol Technologies (Germany) was used to measure the dielectric constant, capacitance and Tan δ at 110 Hz frequency. The input required for the impedance analyzer was thickness and area of the sample to be measured. A 2-sq.cm sample area with 80 micrometer sample thickness was used.

The piezoelectric constant (d33-pC/N) was measured by piezotest piezometer with operating frequency of 110 Hz. The dynamic force applied during measurement was 0.25 N. Both impedance analyzer and piezometer measurements are given in Table 3.

TABLE 3

| Sample No. | d33 (pC/N) | Capacitance (pF) | Dielectric Constant (@100 Hz) | Tan δ |
|---|---|---|---|---|
| 1 | 55 | 1533 | 110 | 0.0498 |
| 2 | 58 | 571 | 65 | 0.0497 |
| 3 | 60-65 | 194 | 40 | 0.0433 |

Nanoindentation Results. Mechanical properties (modulus and hardness) was measured by using the Nano-Indenter® XP (Keysight Technologies, Inc., Santa Rosa, Calif.). On each sample, 10 indents were made and average values were calculated as per Olivier and Pharr method. The average values and the standard deviation are given in Table 4. The hardness and modulus of the composite film decreased after addition of glycerol as shown in Table 4. The modulus after adding 20 wt. % glycerol was around 0.7 to 4.3 GPa.

TABLE 4

| Sample No. | Modulus (Gpa) | Stdev | Range (Modulus) | Hardness (Gpa) | Stdev | Range (hardness) |
|---|---|---|---|---|---|---|
| 1 | 3.89 | 2.05 | 1.7-7.9 | 0.07 | 0.04 | 0.026-0.159 |
| 2 | 2.91 | 1.51 | 0.6-4.9 | 0.07 | 0.05 | 0.013-0.14 |
| 3 | 1.78 | 1.13 | 0.7-4.3 | 0.046 | 0.04 | 0.014-0.13 |

Although embodiments of the present application and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the above disclosure, processes, machines, manufacture, compositions of matter, means, methods, or steps, presently existing or later to be developed that perform substantially the same function or achieve substantially the same result as the corresponding embodiments described herein can be utilized. Accordingly, the appended claims are intended to include within their scope such processes, machines, manufacture, compositions of matter, means, methods, or steps.

The invention claimed is:

1. A piezoelectric composite comprising a piezoelectric additive, a polymeric matrix, and 3 wt. % to 30 wt. % of a polyol based on the total weight of the piezoelectric composite;
   wherein the piezoelectric composite is mechanically flexible film; and
   wherein the polymeric matrix comprises a polyvinylidene difluoride (PVDF) polymer.

2. The piezoelectric composite of claim 1, wherein the polyol is glycerol, alkylene glycols or mixtures thereof.

3. The piezoelectric composite of claim 1, wherein the polyol comprises glycerol.

4. The piezoelectric composite of claim 3, wherein the piezoelectric composite has a piezoelectric constant ($d_{33}$ pC/N) that is greater than the piezoelectric constant of the piezoelectric composite absent the polyol.

5. The piezoelectric composite of claim 4, wherein the $d_{33}$ of the piezoelectric composite having the polyol is greater than 55 pC/N.

6. The piezoelectric composite of claim 1, wherein the piezoelectric composite has a dielectric constant at 100 Hz that is less than the dielectric constant of the piezoelectric composite absent the polyol at 100 Hz.

7. The piezoelectric composite of claim 6, wherein the dielectric constant of the piezoelectric composite having the polyol is less than 100.

8. The piezoelectric composite of claim 1, wherein the piezoelectric additive is dispersed in the polymeric matrix and the glycerol is solubilized in the polymeric matrix.

9. The piezoelectric composite of claim 1, wherein the piezoelectric additive is a ceramic.

10. The piezoelectric composite of claim 1, wherein the piezoelectric composite comprises 2 to 70 wt. % polymer matrix and 30 to 98 wt. % lead zirconate titanate (PZT).

11. The piezoelectric composite of claim 10, having:
    a $d_{33}$ of at least 60 pC/N; and
    a dielectric constant at 100 Hz of less than 65.

12. The piezoelectric composite of claim 1, wherein the polymeric matrix comprises a thermoplastic or thermoset polymer or blends thereof.

13. A method of producing the piezoelectric composite of claim 1, the method comprising:
    (a) obtaining a solution comprising polyol, a polymer, and optional solvent, wherein the solution includes at least 1 wt. % of the polyol based on the weight percentage of polymer;
    (b) dispersing a piezoelectric additive in the solution; and
    (c) subjecting the dispersion of step (b) to conditions suitable to form the piezoelectric composite.

14. The method of claim 13, wherein step (c) conditions comprise
    (i) solvent casting the dispersion on a substrate;
    (ii) air/drying/heat treating the step (i) dispersion to form a composite; and
    (iii) applying a poling field to the composite to form a piezoelectric composite.

15. The method of claim 13, wherein the step (a) solution comprises 1 to 30 wt. % of polyol, and 70 wt. % to 99 wt. % polymer.

16. The method of claim 13, wherein:
    the polyol is glycerol;
    the polymer is a thermoplastic polymer, a thermosetting polymer or copolymer, or a blend thereof; and/or
    the piezoelectric additive is a perovskite material.

17. The method of claim 13, wherein the composite is a film or sheet.

18. A piezoelectric device comprising any one of the piezoelectric composites of claim 1.

19. The piezoelectric device of claim 18, wherein the device is a piezoelectric sensor, a piezoelectric transducer, or a piezoelectric actuator.

* * * * *